Jan. 21, 1969 H. SEIDEL 3,423,688

HYBRID-COUPLED AMPLIFIER

Filed Nov. 9, 1965 Sheet 1 of 3

INVENTOR
H. SEIDEL
BY
Lyman Sherman
ATTORNEY 3,423,688
Patented Jan. 21, 1969

3,423,688

HYBRID-COUPLED AMPLIFIER

Harold Seidel, Fanwood, N.J., assignor to Bell Telephone Laboratories, Incorporated, New York, N.Y., a corporation of New York Filed Nov. 9, 1965, Ser. No. 507,011
U.S. Cl. 330—53 5 Claims
Int. Cl. H03f *3/60*

ABSTRACT OF THE DISCLOSURE

Out-of-band stability for a hybrid-coupled amplifier structure is realized by using quadrature hybrids in the fan-out. To extend the bandwidth, a broadband 180 degree phase shift is introduced in one of the wavepaths connecting symmetrically situated hybrids. The difficulties incidental to producing a large multiplicity of broadband 180 degree phase shifters are countered by using a balanced fan-out, and interconnecting corresponding out-of-phase portions of the fan-out.

This invention relates to multibranched amplifier and oscillator circuits.

Until very recently, the utilization of many solid-state active circuit components, such as transistors and tunnel diodes, for example, has been limited to relatively low power applications. This was due to the low power handling capability of such devices and their relatively high cost which discouraged their use in large numbers as a means of overcoming their limited power handling capacity. Recently, however, there has been a substantial reduction in the cost of many solid-state devices which, in turn, now makes it commercially feasible to use them in relatively large numbers.

The technical problems associated with operating large numbers of active elements in a parallel array are problems of synchronization and stabilization. Stating the problem briefly, the many independent active elements must be synchronized so as to cooperate in a manner to produce maximum output power for the desired mode of operation, while, at the same time, the active elements must be incapable of cooperating at all other possible modes of operation. The suppression of spurious modes must be insured both without the frequenccy range of interest as well as within the frequency range of interest, thus insuring unconditionally stable operation.

In United States Patent 3,021,490 issued to R. Kompfner on Feb. 13, 1962, and in an article entitled "Hybrid-Coupled VHF Transistor Power Amplifier," by R. M. Kurzrak, S. J. Mehlman and A. Newton, published in the August 1965 issue of Solid State Design—Communications and Data Equipment, there are illustrated examples of hybrid-coupled power amplifiers, designed to take advantage of the isolating properties of hybrid networks. In both of these prior art references, 180 degree hybrid junctions are used as the power dividing (and power recombining) elements because of their well-known broadband power dividing characteristic. There is, however, a second property of a power divider which must be taken into account if a multibranched amplifier using power dividers is to be unconditionally stable. This second property is the impendance-match characteristic of the power divider as a function of frequency. Typically, a 180 degree hybrid junction is impendance-matched over only a relatively narrow range of frequencies and, as such, carries with it a tendency toward instability if the frequency range of activity of the active element is greater than the frequency range over which the hybrid is impendance-matched. This, typically, is the case when tunnel diodes are used, since they are known to have a negative resistance over a range of frequencies which extends down to direct current. This potentiality for instability renders multibranched amplifiers and oscillators which use 180 degree hybrid junctions unacceptable for some applications.

In accordance with the present invention, out-of-band as well as in-band stability is achieved by the use of quadrature hybrid junctions in a hybrid fan-out structure. To avoid narrowing of the in-band frequency response as the number of stages are increased a broadband 180 degree phase shift is introduced between hybrids in the manner disclosed by E. A. J. Marcatili and D. H. Ring in United States Patent 3,184,691. However, to avoid the expense, and counter the difficulties of providing a large number of broadband 180 degree phase shifters, a balanced fan-out is used in which one-half of the fan-out operates 180 degrees out of phase with the other half. In such a system, a 180 degree phase shift is obtained, wherever required, by the interconnection of symmetrical portions of the balanced system. Such an arrangement reduces to only two the number of instances in which a broadband 180 degree phase shift is required, i.e., one at the input end of the system, and the other at the output end. This reduction in complexity and cost, raises the hybrid fan-out circuit from the ranks of a laboratory curiosity of some interest, to a commercially practical circuit of great interest.

These and other objects and advantages, the nature of the present invention, and its various features, will appear more fully upon consideration of the various illustrative embodiments now to be described in detail in connection with the accompanying drawings, in which.

Figure 1:
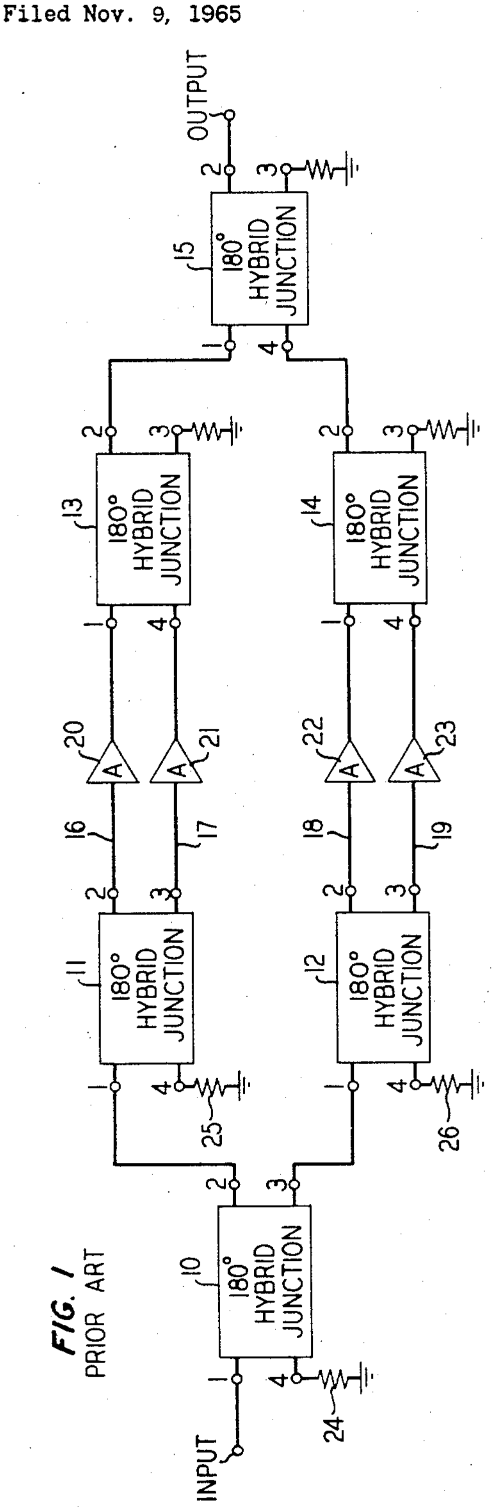
FIG. 1 PRIOR ART
FIG. 1 shows four hybrid-coupled amplifiers in accordance with the prior art.

Referring to the drawings, FIG. 1 shows four hybrid-coupled amplifiers in accordance with the teachings of the prior art as illustrated, for example, by Kompfner in his above-cited patent. The circuit comprises six hybrid junctions 10, 11, 12, 13, 14 and 15 arranged in a fan-out so as to provide four parallel branches 16, 17, 18 and 9. Each of these branches includes an amplifier 20, 21, 22 or 23 which operates upon a portion of the applied signal.

Before proceeding with an explanation of the operation of such an amplifier circuit, some general comments might advantageously be made about the circuit as a whole and about some of the circuit components. In particular, it was noted previously that one of the problems associated with operating a multiplicity of active elements in concert is to insure that they cooperate in a manner to produce maximum output power for the desired mode of operation while, at the same time, to insure that they are rendered incapable of cooperating for all other possible modes of operation. The amplifier circuit shown in FIG. 1 utilizes the isolating properties of a hybrid junction for this purpose.

In general, a hybrid junction is a four branch, power-dividing network in which the branches are arranged in pairs, with the branches comprising each pair being conjugate to each other and in coupling relationship with the branches of the other of said pairs. The power-division ratio of a hybrid junction is a matter of design. However, as commonly used, the term generally refers to a 3 db power divider in which the incident power to one branch of one pair of conjugate branches divides equally between the other pair of conjugate branches.

Hybrid junctions can be further divided into two general classes. In one class, which includes the "magic tee" and the "rat race bridge," as examples, the output voltages are either in phase, or 180 degrees out of phase. The second class of hybrid junctions, which includes the forward-coupled Riblet coupler and multihole directional coupler, and the backward-coupled, quarter-wave directional couplers, as examples, are quadrature phase shift devices in which the output voltages differ by 90 degrees. Each of these two classes has their own particular frequency sensitive power-dividing and impedance-matching characteristics. Typically the 180 degree hybrids have a broader band power-dividing characteristic than the quadrature hybrids. On the other hand, the quadrature hybrids and, in particular, the backward-coupled embodiments, have a broader band impedance-matching characteristic than the 180 degree hybrids. The prior art, as typified by FIG. 1, uses 180 degrees hybrids because they are broadband in their power-dividing properties and, generally, can be impedance-matched over the operating frequency of interest, if it is not too broad.

The operation of the amplifier circuit is as follows. An input signal applied to terminal 1 of hybrid 10 is divided equally between the two conjugate branches 2 and 3. Branch 4 is match-terminated by a suitable resistor 24. Branch 2 of hybrid 10 is connected to branch 1 of hybrid 11 wherein the signal derived from branch 2 is again divided into two equal signal components in conjugate branches 2 and 3 of hybrid 11. Similarly, branch 3 of hybrid 10 is connected to branch 1 of hybrid 12 wherein the signal derived from branch 3 is likewise divided into two equal signal components in conjugate branches 2 and 3 of hybrid 12. Branches 4 of both hybrids 11 and 12 are match-terminated by means of suitable resistors 25 and 26, respectively.

The four signal components thus produced are amplified in amplifiers 20, 21, 22 and 23, following which they are recombined, in phase, in hybrids 13, 14 and 15. The output signal appears at branch 2 of hybrid 15.

As long as all the signal paths are substantially identical, and all impedances properly matched, there are basically no stability problems. If, however, some discontinuity in one of the circuits does develop due to aging of a circuit component, or for any other reason, some energy will be reflected back towards the input end of the amplifier. It is apparent that if this reflected energy encounters favorable conditions, an oscillating mode can be produced.

In addition to this in-band possibility, there is also a possibility of out-of-band oscillation being produced when a circuit component, which may be impedance-matched over the operating band, becomes mismatched out of the operating band due to its particular impedance-frequency characteristic. In such a situation, spurious oscillations can be induced out-of-band if, at the same time, the amplifiers have sufficient out-of-band gain.

Ordinarily, the purpose of hybrid coupling is to minimize these tendencies. For example, energy coupled back towards branch 2 of hybrid 11 due to some mismatch in branch 16, is divided equally between branches 1 and 4. The half in branch 4 is dissipated in resistor 25. The half in branch 1 is transmitted back to hybrid 10 where it again undergoes a division. The portion of the energy coupled to branch 4 is dissipated in resistor 24, while the remaining portion enters branch 1. Any discontinuity in the input circuit will cause some of this energy to be reflected back towards the amplifier again. However, it is apparent that the constant division of the reflected signals as they go through the hybrids tends to reduce any reflected energy to a level where its tendency to set up oscillating modes is minimal.

The difficulty arises, however, when the hybrids themselves produce the reflections. In such a situation there is much less isolation between adjacent branches of the amplifier circuit and substantially less attenuation of the reflected energy within any one branch. Thus, if hybrids 11 and 13 were mismatched, there would be reflections, and re-reflections of a significant amount of wave energy within each of the paths 16 and 17, and between paths 16 and 17.

As is known, 180 degree hybrid junctions have a broadband power-dividing characteristic but have a relatively narrow impedance-matching characteristic. Thus, while they may be designed to appear adequately matched over the band of interest, they become mismatched outside the band of interest. For some applications this may not present a problem. However, if the amplifiers are sufficiently active out of band, the impedance mismatch becomes a serious problem.

Recognizing that quadrature hybrids have very broad impedance-matching properties, it may appear advantageous to simply replace all the 180 degree hybrids with quadrature hybrids. While this would solve the mismatch problem, it gives rise to another one. As it is equally well known, the power-dividing properties of quadrature hybrids are relatively narrow band. Cascading quadrature hybrids, as practiced in hybrid-coupled amplifiers, merely aggravate this problem by intensifying, exponentially, this frequency selectivity as the number of stages are increased. One method of obviating the problem is by the addition of one broadband 180 degree phase shifter for each pair of hybrids, in the manner disclosed by Marcatili et al. Such an arrangement is shown in FIG. 2.

Figure 2:
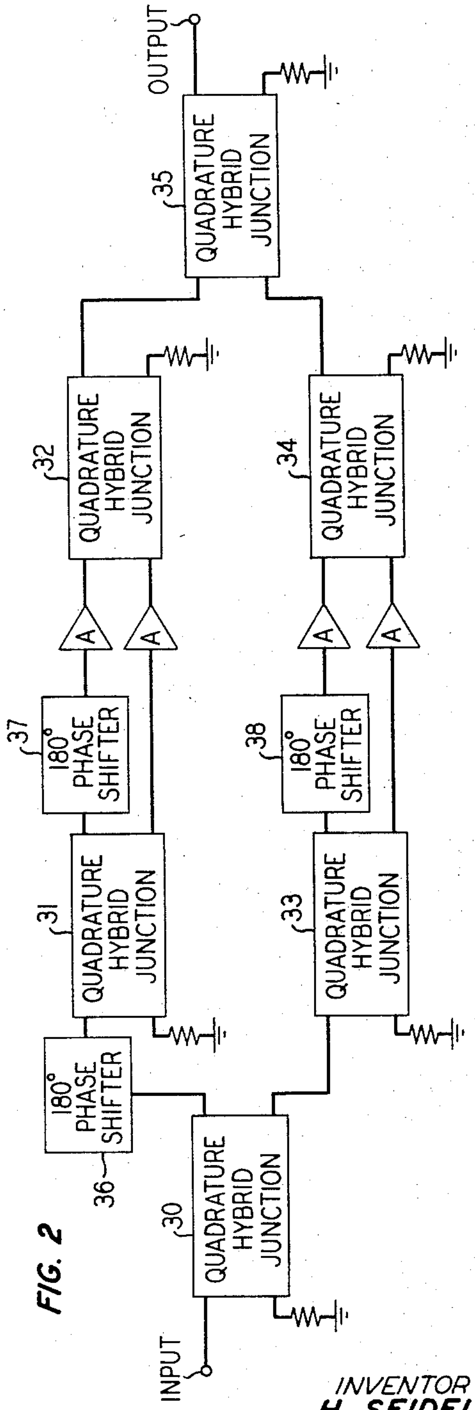
FIG. 2 shows four quadrature hybrid-coupled amplifiers including 180 degree phase shifters for broadbanding the frequency selectivity of the hybrid junctions.

The embodiment of FIG. 2 is in all respects the same as the embodiment of FIG. 1 with the exception that all the hybrids 30, 31, 32, 33, 34 and 35 are quadrature hybrids. In addition, three 180 degree phase shifters 36, 37 and 38 are included in the circuit, one for each pair of hybrids. For example, phase shifter 37 corrects the frequency response of hybrid pairs 31 and 32, phase shifter 38 corrects hybrid pairs 33 and 34, whereas phase shifter 36 corrects hybrid pairs 30 and 35.

The problem with the solution represented by the amplifier circuit shown in FIG. 2 is to obtain broadband 180 degree phase shifters. In a waveguide configuration, the required phase shift can be realized by the simple expedient of introducing a half twist to the waveguide, in the manner illustrated by Marcatili et al. In a two conductor transmission system, however, there is no correspondingly simple expedient and other means for providing the required phase shift must be provided. One such means is the broadband transformer of the type described by C. L. Ruthoff in United States Patent 3,037,175. Such an arrangement, while technically sound, becomes exceedingly expensive if the fanout is large and the number of transformers required becomes correspondingly large.

In accordance with the present invention, the limitations inherent in prior art hybrid-coupled amplifiers are avoided, and the cost of such amplifier circuits is kept low, by means of a balanced fan-out arrangement in which the requisite phase shift is provided by the manner in which the circuit is connected rather than by means of separate phase shifters. Such an amplifier circuit is illustrated in block diagram of FIG. 3.

Figure 3:
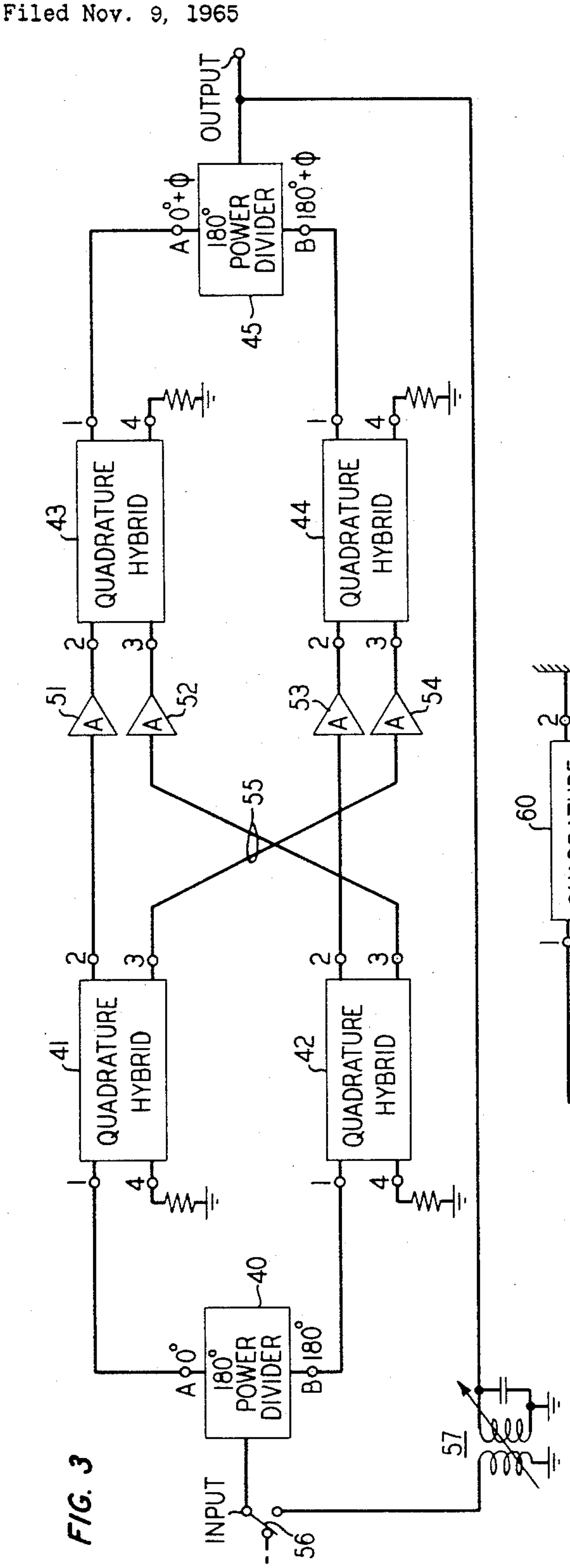
FIG. 3 shows a balanced, quadrature hybrid-coupled amplifier in accordance with the invention.

In the illustrative embodiment of FIG. 3, a combination of two 180 degree power dividers 40 and 45, and four quadrature hybrid junctions 41, 42, 43 and 44 are connected in a balanced fan-out arrangement to produce a four-branched network. One of the four amplifiers 51, 52, 53 and 54 is included in each of the branches.

Of the two 180 degree power dividers, power divider 40 is used in the input end of the fan-out structure to divide the applied wave energy into two equal, out-of-phase signal components. The reciprocal properties of the other 180 degree power divider 45 are utilized in the output end of the fan-out structure to recombine the two signal components and produce the output signal.

In a system having a high order of fan-out, the isolation produced by the quadrature hybrids may be adequate to permit the use of 180 degree hybrid junctions as the input and output power dividers, notwithstanding the possibility of an out-of-band impedance mismatch. If, on the other hand, the isolation is inadequate for any reason, some other arrangement for dividing the input signal and obtaining a broadband 180 degree phase shift between the divided signal components must be used. One such arrangement is illustrated in FIG. 4

Figure 4:
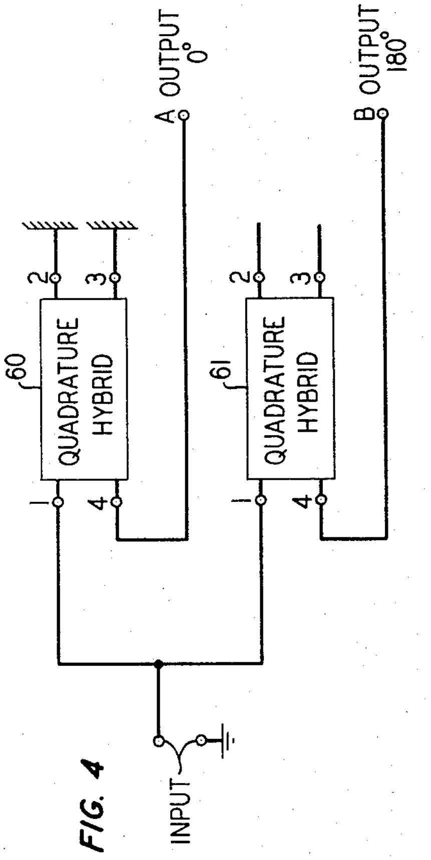
FIG. 4 shows a broadband, 180 degree power divider.

The 180 degree power divider shown in FIG. 4 comprises two broadband quadrature hybrids 60 and 61. Designating branches 1–4 and 2–3 as the conjugate pairs for each hybrid, the input signal is connected in parallel to branches 1, and the two output signals are taken from branches 4.

To obtain the 180 degree phase difference, between the output signal components, branches 2 and 3 of hybrid 60 are short circuited, whereas branches 2 and 3 of hybrid 61 are open circuited. As is known, the coefficients of reflection for these two dissimilar terminations differ by 180 degrees for all frequencies for which the terminations are open and short circuits. As a result, the signal components reflected from the terminations in each of the two hybrids combine, and leave the respective hybrids through branches 4 out of phase.

Referring again to FIG. 3, the signals in the portion of the fan-out energized from terminal A of power divider 40 are 180 degrees out of phase with the respective signals in the portion of the fan-out energized from terminal B of power divider 40. Because of the symmetry of the structure, a broadband 180 degree phase shift can be obtained, wherever required, by a suitable interconnection between corresponding points of the two balanced halves of the fan-out. Thus, to introduce a 180 degree phase shift in the path between branches 3 of hybrids 41 and 43, a cross connection 55 is made such that branch 3 of hybrid 41 connects to branch 3 of hybrid 44 through amplifier 54, and branch 3 of hybrid 42 connects to branch 3 of hybrid 43 through amplifier 52. Since the signal at branch 3 of hybrid 41 is, in all respects, identical to the signal at branch 3 of hybrid 42, except for a 180 degree phase difference, the cross connection provides a simple, inexpensive and convenient way of obtaining a broadband 180 degree phase shift. In particular, it is accomplished without the need of adding carefully compensated (and, hence, expensive) phase shifters.

In all other respects, the amplifier of FIG. 3 operates as any hybrid-coupled amplifier with the notable difference that the circuit is impedance matched over a much broader frequency range, and, as such, is inherently much more stable.

Figure 5:
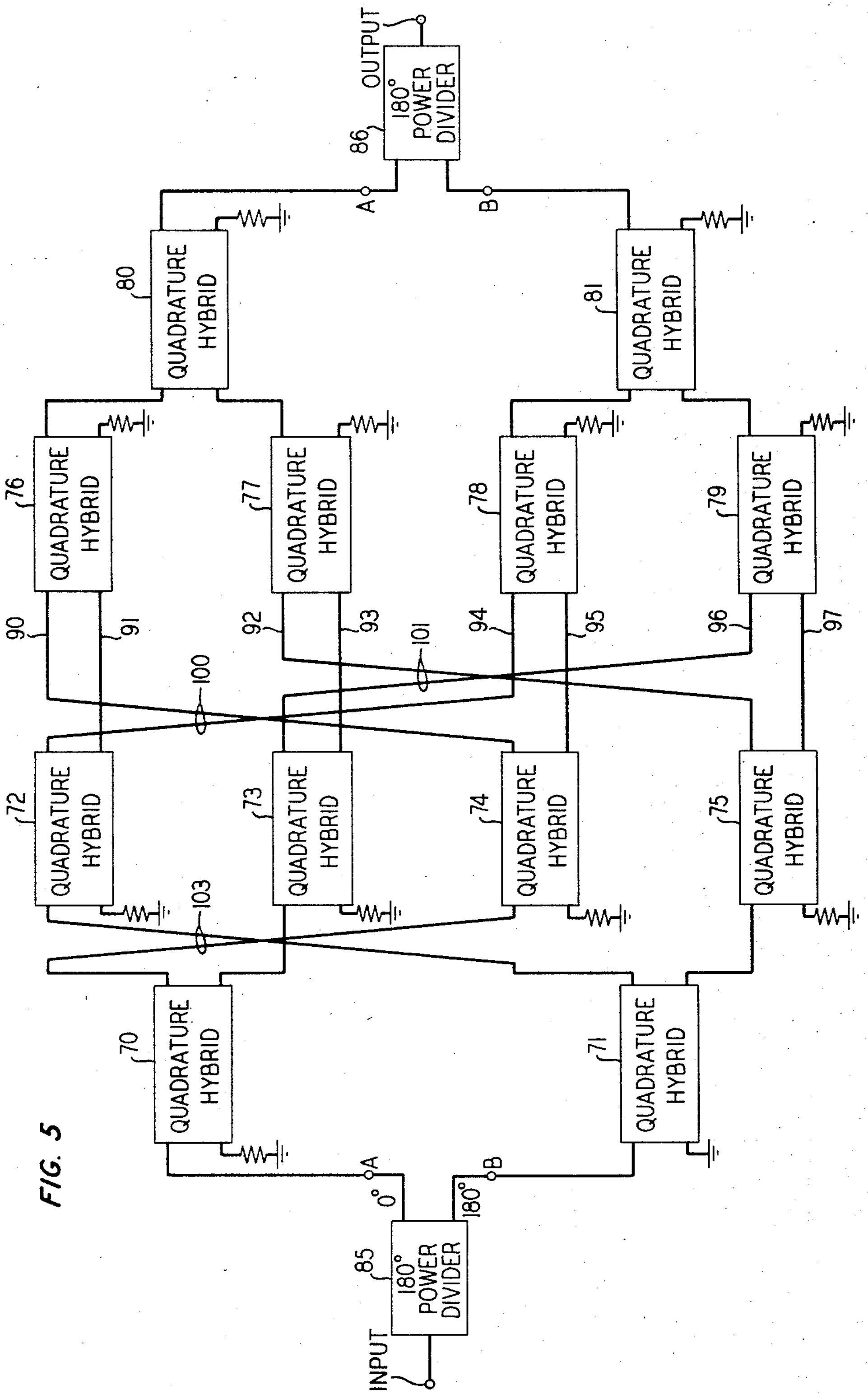
FIG. 5 shows an eight-branched, balanced fan-out.

The principles of the present invention can be extended to higher order balanced fan-outs as illustrated in FIG. 5. In this illustration, eight branches 90 to 97 are obtained using twelve quadrature hybrids 70 to 81 and two 180 degree power dividers 85 and 86. As in the embodiment of FIG. 3, broadband 180 degree phase shift is obtained by a transposition of connections between corresponding portions of the balanced structure. Thus, 180 degree phase shifts in one of the paths between hybrids 72 and 76, and in one of the paths between hybrids 74 and 78, are mutually obtained by cross connection 100. Similarly, the required phase shifts between hybrids 73 and 77, and between 75 and 79 are mutually obtained by cross connection 101. A third cross connection 103 provides the necessary phase shifts between hybrids 70 and 80, and hybrids 71 and 81.

Though not shown in FIG. 5, amplifiers, or other signal processing apparatus, would be included in each of the branches 90–97.

An examination of the circuits illustrated in FIGS. 3 and 5 reveal a symmetry in the arrangement of the power dividers and in the manner in which the 180 degree interconnections are made. For example, the arrangement of power dividers supplying signal energy to the network branches 90–97 is the mirror image of the arrangement of power dividers used to recombine the signal energy. Similarly, that portion of the power-dividing and recombining network between terminals A of the two 180 degree power dividers is the mirror image of that portion of the power-dividing and recombining network between terminals B of the 180 degree power dividers.

The number of 180 degree phase shifts required is equal to the number of pairs of quadrature hybrids, there being a 180 degree phase shift between each hybrid in the input portion of the fan-out and a symmetrically located hybrid in the output portion of the fan-out. Thus, in FIG. 5, there is a 180 degree phase shift between each of the hybrid pairs, 72–76, 73–77, 74–78, 75–79, 70–80 and 71–81.

The 180 degree phase shifts are obtained in pairs by a transposition of connections between corresponding portions of the two out-of-phase halves of the balanced fan-out structure. Thus, in FIG. 5, there is a transposition of connections between the uppermost branch 90 of the upper half of the fan-out, and the uppermost branch 94 of the lower (out-of-phase) half of the fan-out. This provides the required phase shift between hybrid pairs 72–76 and 74–78. Similarly, a transposition of connections between the third branch 92 in the upper half of the fan-out and the third branch 96 in the lower half of the fan-out provides the required phase shift between hybrid pairs 73–77 and 75–79.

In like fashion, a transposition between a branch of hybrid 70 and the corresponding branch of hybrid 71 provides the required phase shift between hybrid pairs 70–80 and 71–81.

The balanced fan-out network of FIGURES 3 and 5 can be extended to provide 16, 32 or, more generally, $2^n$ branch wavepaths using $2(2^n-2)$ quadrature hybrid junctions and two 180 degree power dividers, where $n$ is a positive integer. In each of these higher order fan-out circuits, a 180 degree phase shift is introduced between each of the quadrature hybrids in the input half of the fan-out and a symmetrically located quadrature hybrid in the output half of the fan-out by a transposition of connections between corresponding regions of the out-of-phase portions of the fan-out.

As is apparent, the number of quadrature hybrids increases as the number of paths increases. Nevertheless, high order hybrid-coupled fan-outs of moderate physical size can be made using currently available hybrids of which the QH–2 series, produced by Merrimac Research and Development, Incorporated of Irvington, N.J., are examples.

It is recognized that the amplifier circuits of FIGS. 3 and 5 can also be used to produce stable, single mode oscillators by selective coupling back to the input of the amplifier structure a portion of the output signal. This can be done in the illustrative embodiment of FIG. 3 by means of a switch 56 which connects the input branch of power divider 40 to the output branch of power divider 45 through an inductively-coupled tuned circuit 57. The latter is adjusted to satisfy the well-known amplitude and phase criteria for oscillations.

As indicated hereinabove, one aspect of the present invention is to insure a state of unconditional stability. To this end, it is highly advantageous that all of the signal paths be as similar as possible. However, as the system is designed for the specific purpose of rendering harmless the consequences of asymmetry and imbalance, the degree of similarity among the various paths is a matter of choice, to be made consistent with all other design considerations such as cost, size, efficiency, et cetera.

While the invention has been explained with reference to particular structures and with reference to amplifiers and oscillators, it is to be understood that this was merely by way of example. The principles of the invention are equally applicable to any situation which requires that many parallel paths be provided for some purpose, and wherein conditions for the generation of spurious oscillations or other types of multimode operation would be possible, but undesirable. Thus, in all cases it is understood that the above-described arrangements are illustrative of a small number of the many possible specific embodiments which can represent applications of the principles of the invention. Numerous and varied other arrangements can readily be devised in accordance with these principles by those skilled in the art without departing from the spirit and scope of the invention.

What is claimed is:

1. A multibranched circuit comprising:
input and output 180 degree power dividers;
a plurality of $(2(2^n+2)$ 3 db quadrature hybrid junctions connected between said 180 degree power dividers in a balanced fan-out arrangement to provide $2^n$ branches, where *n* is any positive integer;
and means for providing a 180 degree phase shift between each quadrature hybrid in the input end of said fan-out and a symmetrically located quadrature hybrid in the output end of said fan-out by transposing connections between corresponding out-of-phase portions of said fan-out.

2. The multibranched circuit of claim 1 wherein each of said $2^n$ branches includes an amplifier.

3. The multibranched circuit of claim 2 including means for coupling a portion of the output signal back to the input of said circuit.

4. A balanced multibranched network comprising:
input means for dividing signal wave energy into two equal, 180 degree out-of-phase signal components;
output means for combining two, 180 degree out-of-phase signal components in phase;

first and second identical networks connecting said input and said output means;
characterized in that each network includes:
a first plurality of $2^n-1$ quadrature hybrid junctions for dividing each signal component into $2^n$ signal components, wherein *n* is an integer;
a second plurality of $2^n-1$ quadrature hybrid junctions in each of said wavepaths for recombining said $2^n$ signal components in *n* successive binary levels of recombination;
and means for introducing a 180 degree relative phase shift in one of the output branches of selected pairs of corresponding hybrids by a transposition of corresponding connections between said two networks wherein said one output branch of each of said selected hybrids in each of said networks is connected to the input branch of a hybrid of the next level of division or recombination in the other of said networks.

5. The network according to claim 4 including means for amplifying each of said $2^n$ signal components before recombination.

References Cited

UNITED STATES PATENTS 3,184,691 5/1965 Marcatili et al. -------- 333—11

NATHAN KAUFMAN, *Primary Examiner.*

U.S. Cl. X.R.

330—124; 333—11; 328—166